(12) United States Patent
Herner

(10) Patent No.: US 8,258,020 B2
(45) Date of Patent: Sep. 4, 2012

(54) INTERCONNECTS FOR STACKED NON-VOLATILE MEMORY DEVICE AND METHOD

(75) Inventor: Scott Brad Herner, San Jose, CA (US)

(73) Assignee: Crossbar Inc., Santa Clara, CA (US)

(*) Notice: Subject to any disclaimer, the term of this patent is extended or adjusted under 35 U.S.C. 154(b) by 35 days.

(21) Appl. No.: 12/939,824

(22) Filed: Nov. 4, 2010

(65) Prior Publication Data

US 2012/0112155 A1 May 10, 2012

(51) Int. Cl.
*H01L 29/04* (2006.01)

(52) U.S. Cl. ........ 438/128; 438/586; 438/264; 438/591; 438/287; 438/486; 438/257; 438/593; 438/430

(58) Field of Classification Search ............... 438/128, 438/586, 264, 591, 287, 486, 257, 593, 430, 438/E45.003, E21.614, E29.309, E21.409, 438/E21.423, 587; 257/E29.309, E21.294
See application file for complete search history.

(56) References Cited

U.S. PATENT DOCUMENTS

| | | | |
|---|---|---|---|
| 6,939,787 B2 | 9/2005 | Ohtake et al. | |
| 7,023,093 B2 * | 4/2006 | Canaperi et al. | 257/760 |
| 7,238,607 B2 | 7/2007 | Dunton et al. | |
| 7,474,000 B2 | 1/2009 | Scheuerlein et al. | |
| 7,550,380 B2 | 6/2009 | Elkins et al. | |
| 7,786,589 B2 * | 8/2010 | Matsunaga et al. | 257/773 |
| 7,824,956 B2 | 11/2010 | Schricker et al. | |
| 7,829,875 B2 | 11/2010 | Scheuerlein | |

(Continued)

FOREIGN PATENT DOCUMENTS

KR 1020110014248 A 10/2011

OTHER PUBLICATIONS

Office Action for U.S. Appl. No. 12/814,410 dated Apr. 17, 2012.

(Continued)

*Primary Examiner* — Marc Armand
(74) *Attorney, Agent, or Firm* — Ogawa P.C.

(57) ABSTRACT

A method of forming a vertical interconnect for a memory device. The method includes providing a substrate having a surface region and defining a cell region, a first peripheral region, and a second peripheral region. A first thickness of dielectric material is formed overlying the surface region. A first bottom wiring structure spatially configured to extend in a first direction is formed overlying the first dielectric material for a first array of devices. A second thickness of a dielectric material is formed overlying the first wiring structure. The method includes forming an opening region in the first peripheral region. The opening region is configured to extend in a portion of at least the first thickness of dielectric material and the second thickness of dielectric material to expose a portion of the first wiring structure and to expose a portion of the substrate. A second bottom wiring material is formed overlying the second thickness of dielectric material and filling the opening region to form a vertical interconnect structure in the first peripheral region. A second bottom wiring structure is formed from the second wiring material for a second array of devices. The second bottom wiring structure is separated from the first bottom wiring structure by at least the second thickness of dielectric material and spatially configured to extend in the first direction. The first wiring structure and the second wiring structure are electrically connected by the vertical interconnect structure in the first peripheral region to a control circuitry on the substrate.

22 Claims, 13 Drawing Sheets

U.S. PATENT DOCUMENTS

| | | | |
|---|---|---|---|
| 7,968,419 | B2 | 6/2011 | Li et al. |
| 8,088,688 | B1 | 1/2012 | Herner |
| 8,097,874 | B2 | 1/2012 | Venkatasamy et al. |
| 2004/0194340 | A1 | 10/2004 | Kobayashi |
| 2007/0087508 | A1 | 4/2007 | Herner |
| 2007/0105390 | A1 | 5/2007 | Oh |
| 2009/0256130 | A1 | 10/2009 | Schricker |
| 2010/0012914 | A1 | 1/2010 | Xu et al. |
| 2010/0019310 | A1 | 1/2010 | Sakamoto |
| 2010/0084625 | A1 | 4/2010 | Wicker et al. |
| 2010/0085798 | A1 | 4/2010 | Lu et al. |
| 2010/0090192 | A1 | 4/2010 | Goux et al. |
| 2010/0101290 | A1 | 4/2010 | Bertolotto |
| 2010/0102290 | A1 | 4/2010 | Lu et al. |
| 2010/0157710 | A1 | 6/2010 | Lambertson et al. |
| 2011/0133149 | A1 | 6/2011 | Sonehara |
| 2011/0284814 | A1 | 11/2011 | Zhang |
| 2012/0008366 | A1 | 1/2012 | Lu |
| 2012/0012806 | A1 | 1/2012 | Herner |
| 2012/0015506 | A1 | 1/2012 | Jo et al. |
| 2012/0025161 | A1 | 2/2012 | Rathor et al. |
| 2012/0033479 | A1 | 2/2012 | Delucca et al. |
| 2012/0043654 | A1 | 2/2012 | Lu et al. |

OTHER PUBLICATIONS

Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Office Action for U.S. Appl. No. 12/913,719 dated Feb. 17, 2011.
Office Action for U.S. Appl. No. 12/913,719 dated Jul. 22, 2011.
Notice of Allowance for U.S. Appl. No. 12/913,719 dated Mar. 12, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley..
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al, "Aluminum spiking at contact windows in Al/Ti-W/Si", Appl. Phys. Lett. Jan. 25, 1988, pp. 272-274, vol. 52 No. 4, American Institute of Physics.
J. Del Alamo et al, "Operating limits of Al-alloyed high-low junction for BSF solar cells", Solid-State Electronics, 1981, pp. 415-420, vol. 24, Pergamon Press Ltd., Great Britain.
Hao-Chih Yuan et al, "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.

* cited by examiner

Cross Section View
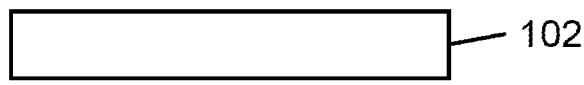 — 102
 — 104
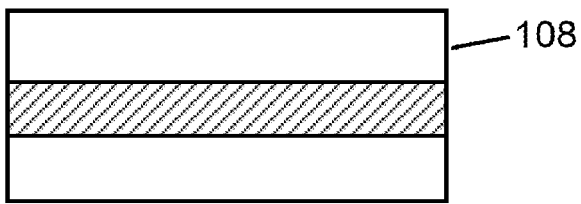 — 108
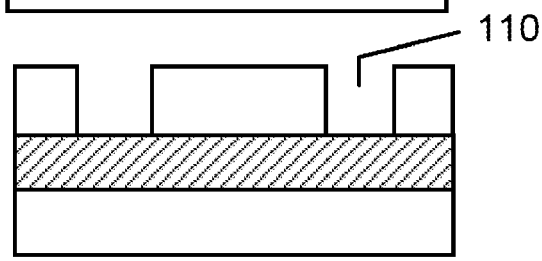 — 110
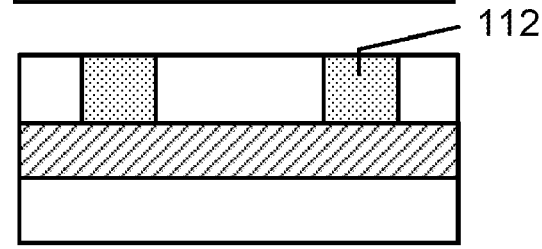 — 112
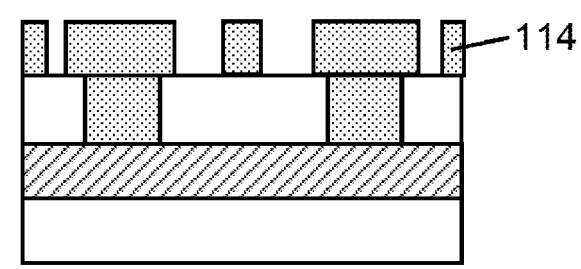 — 114
Top View
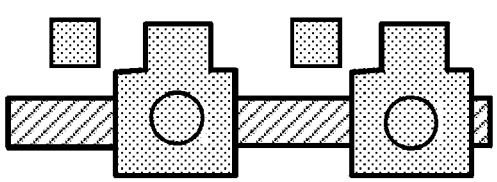
Figure 1
(Prior Art)

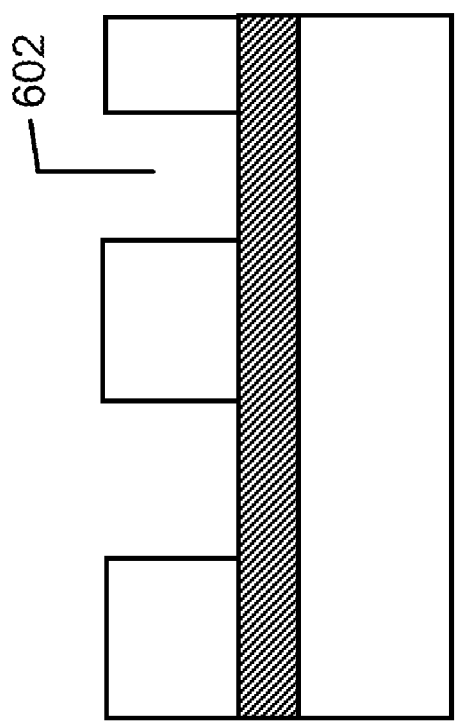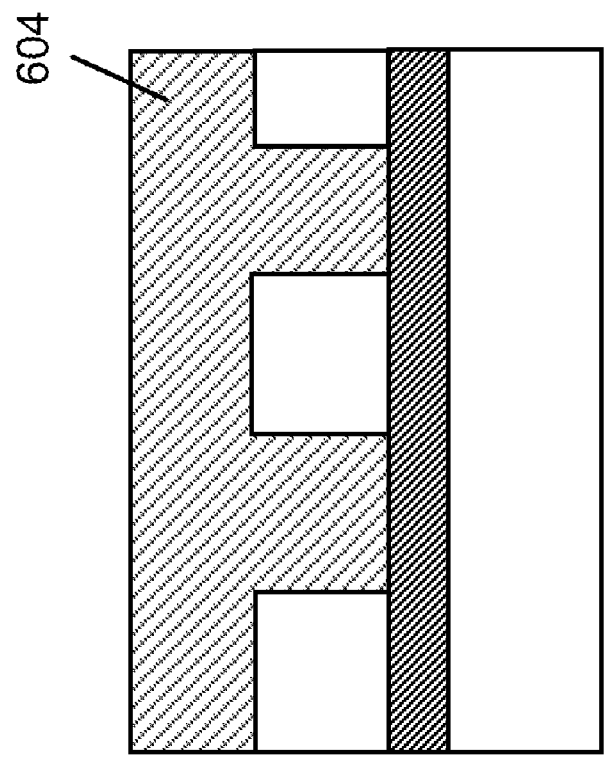

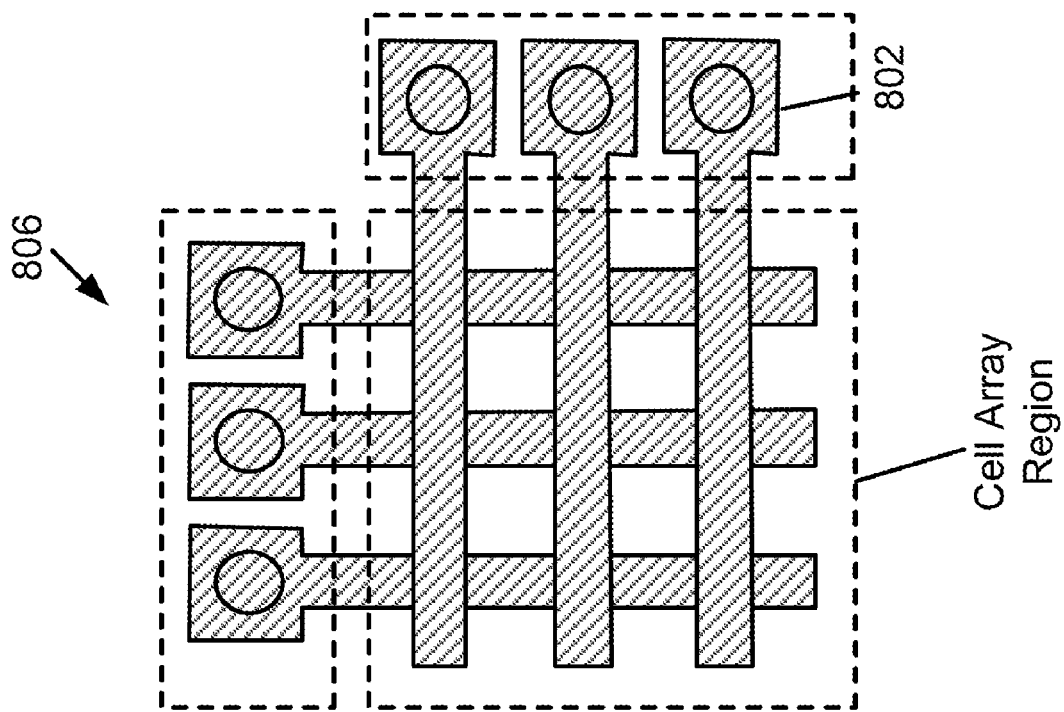
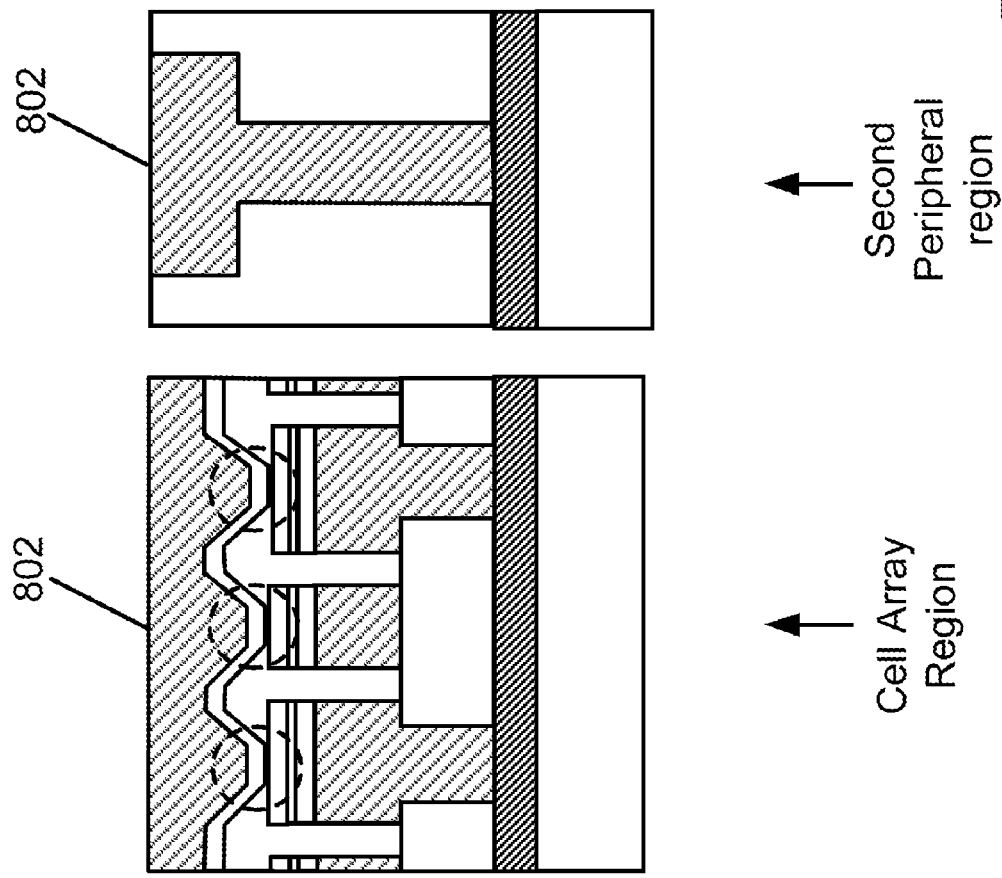
Figure 8

INTERCONNECTS FOR STACKED NON-VOLATILE MEMORY DEVICE AND METHOD

CROSS REFERENCE TO RELATED APPLICATIONS

Not Applicable

STATEMENTS RELATED TO GOVERNMENT OR FEDERAL FUNDED RESEARCH

Not Applicable

BACKGROUND OF THE PRESENT INVENTION

The present invention is generally related to resistive switching devices. More particularly, embodiments according to the present invention provide a method and a structure for forming an interconnect structure for a stacked resistive switching device. The present invention can be applied to non-volatile memory devices but it should be recognized that the present invention can have a much broader range of applicability.

The success of semiconductor devices has been mainly driven by an intensive transistor down-scaling process. However, as field effect transistors (FET) approach sizes less than 100 nm, problems such as the short channel effect degrade device performance. Moreover, such sub 100 nm device sizes can lead to sub-threshold slope non-scaling and increase in power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching a PCRAM device requires a large amount of power. Organic RAM or ORAM is incompatible with large volume silicon-based fabrication and device reliability is usually poor.

From the above, a new semiconductor device structure and integration is desirable

BRIEF SUMMARY OF THE PRESENT INVENTION

The present invention is generally related to resistive switching devices. More particularly, embodiments according to the present invention provide a method and a structure for forming an interconnect structure for a stacked resistive switching device. The present invention can be applied to non-volatile memory devices but it should be recognized that the present invention can have a much broader range of applicability.

In a specific embodiment, a method of forming a vertical interconnect for a memory device is provided. The method includes providing a substrate having a surface region. A least a cell region, a first peripheral region, and a second peripheral region are defined on the substrate. The method forms a first thickness of dielectric material overlying the surface region. A first bottom wiring structure for a first array of devices is formed overlying the first dielectric material. In a specific embodiment, the first bottom wiring structure is spatially configured to extend in a first direction. A second thickness of a dielectric material is formed overlying the first wiring structure. In a specific embodiment, the method forms an opening region in the first peripheral region extending in a portion of at least the first thickness of dielectric material and the second thickness of dielectric material to expose a portion of the first wiring structure and to expose a portion of the substrate. The method includes depositing a second bottom wiring material overlying the second thickness of dielectric material and filling the opening region to form a vertical interconnect structure in the first peripheral region. The method includes forming a second bottom wiring structure from the second wiring material for a second array of devices. The second bottom wiring structure is separated from the first bottom wiring structure by at least the second thickness of dielectric material. In a specific embodiment, the second bottom wiring structure is spatially configured to extend in the first direction. The first wiring structure and the second wiring structure are electrically connected by the vertical interconnect structure in the first peripheral region to a control circuitry on the substrate in a specific embodiment.

In a specific embodiment, a method of forming a memory device is provided. The method includes providing a substrate having a surface region. A cell region, a first peripheral region, and a second peripheral region is defined on the substrate. A first dielectric material is formed overlying the surface region of the semiconductor substrate. The method includes forming a first crossbar array of memory cells in the cell region overlying the first dielectric material. The first crossbar array of memory cells includes a first bottom wiring structure, a first top wiring structure and a first switching element. The first bottom wiring structure is spatially extending in a first direction and includes a portion extending into the first peripheral region in a specific embodiment. In a specific embodiment, the first top wiring structure is configured to spatially extend in a second direction perpendicular to the first direction and includes a portion extending into the second peripheral region. In a specific embodiment, the first switching region is formed sandwiched in an intersection region between the first top wiring structure and the first bottom wiring structure. The method includes forming a second dielectric material overlying the first crossbar array of memory cells. In a specific embodiment the method includes forming a via opening in a portion of the first periphery region to expose a portion of the first bottom wiring structure and a portion of the substrate. A second bottom wiring material is deposited to fill the via opening and to form a thickness of second bottom wiring material overlying the second dielectric material. The method includes subjecting the second bottom wiring material to a pattern and etch process to form a second bottom wiring structure for a second array of memory cells, the second bottom wiring structure including a portion spatially extending parallel to the first bottom wiring structure in the cell region and a via structure in the first peripheral region, the via structure electrically connecting the second bottom wiring structure and the first bottom wiring structure to a first control circuitry on the substrate.

In a specific embodiment, a memory device is provided. The memory device includes a semiconductor substrate having a surface region and a first dielectric material overlying the semiconductor substrate. The memory device includes a first wiring structure spatially extending in a first direction and including a first via structure configured in a first peripheral region. The first via structure is electrically connected to a control circuitry on the substrate in a specific embodiment. The memory device includes a second wiring structure spatially extending in a second direction at an angle to the first direction. The second wiring structure further includes a second via structure configured in a second peripheral region. The second via structure is connected to second control circuitry on the substrate in a specific embodiment. The memory device includes a switching region sandwiched between the first wiring structure and the second wiring structure in a cell region. The memory device is disposed in an interconnected crossbar array in a specific embodiment.

In a specific embodiment, a memory device is provided. The memory device includes a semiconductor substrate having a surface region and a first dielectric material overlying the surface region of the semiconductor substrate. The memory device includes a first crossbar array of memory cells. The first crossbar array of memory cells includes a first bottom wiring structure spatially extending in a first direction and including a portion in a first peripheral region. The first crossbar array of memory cells includes a first top wiring structure, spatially extending in a second direction at an angle to the first direction and includes a first via structure configured in a second peripheral region, the first via structure being connected to a first control circuitry on the substrate. In a specific embodiment, the first crossbar array of memory cell includes a first switching region sandwiched between the first top wiring structure and the first bottom wiring structure. In a specific embodiment, the memory device includes a second dielectric material overlying the first array of memory cells. In a specific embodiment, the memory device includes a second array of crossbar array of memory cells overlying the second dielectric material. The second crossbar array of memory cells includes a second bottom wiring structure configured spatially parallel to the first bottom wiring structure direction and including a portion in the first peripheral region. The second crossbar array of memory cells includes a second top wiring structure spatially extending in a second direction parallel to the first top wiring structure. In a specific embodiment, a second switching region is disposed in an intersecting region between the second bottom wiring structure and the second top wiring structure. The memory device includes a via structure disposed in the first peripheral region electrically connecting the first bottom wiring structure and the second bottom wiring structure to a control circuitry on the substrate in a specific embodiment.

Many benefits can be achieved by ways of the present invention. For example, the present method uses a single via structure to connect one or more wiring structures for a stack of memory cells to a control circuitry on the substrate. The single via structure eliminates multiple pattern and etch steps otherwise required to connect each layer of memory cells to their perspective controlling circuitry on the substrate. In other embodiments, the method provides a way to form a multilayer vertically stacked non-volatile memory device characterized by high density and reduced feature size.

SUMMARY OF THE DRAWINGS

FIGS. 1, 2, and 2(a) are simplified diagrams illustrating a conventional method of forming a stacked memory device.

FIG. 3-14 are simplified diagrams illustrating a method of forming a memory device according to embodiments of the present invention.

DETAILED DESCRIPTION OF THE PRESENT INVENTION

Figure 2:
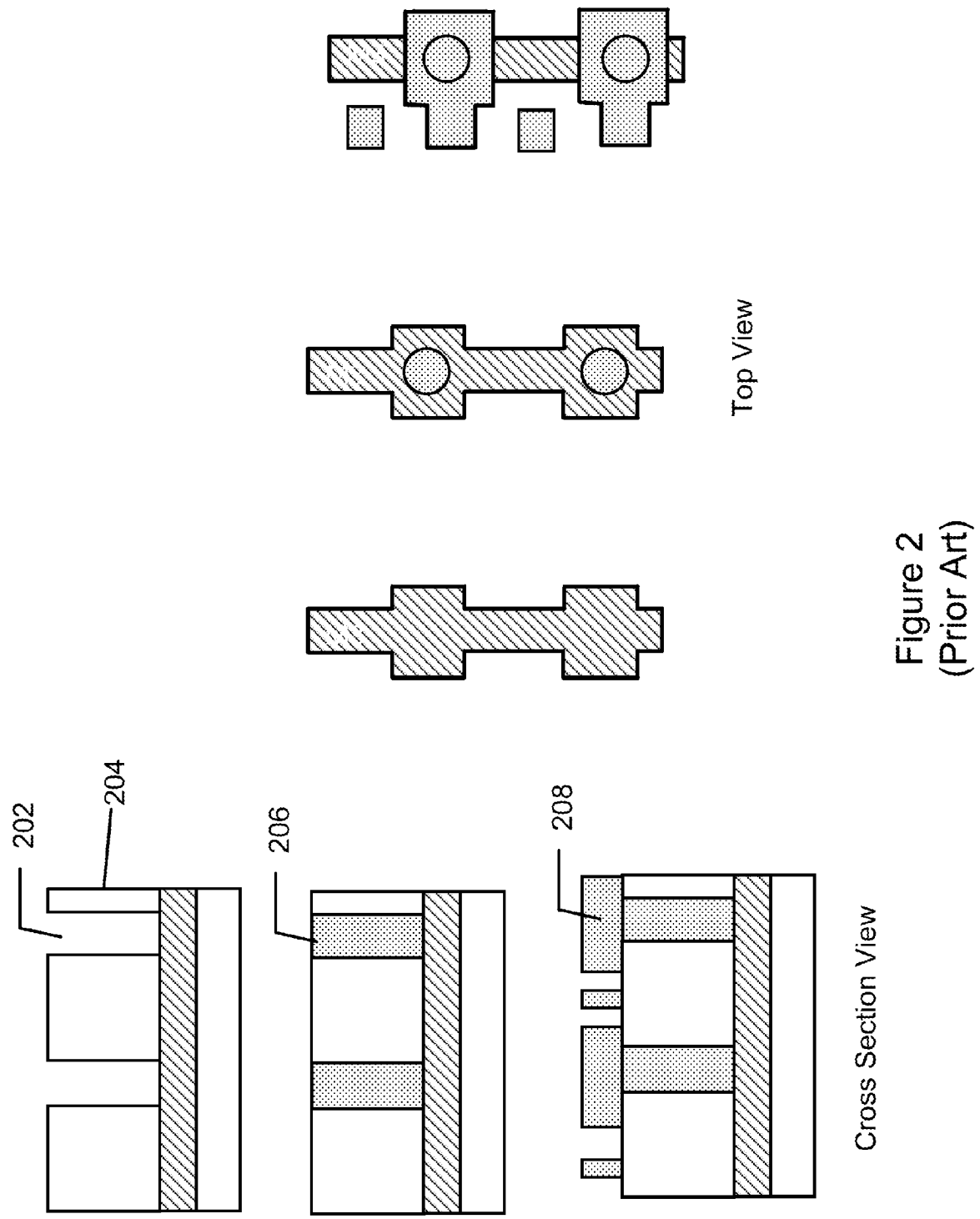

The present invention is directed to memory device. More particularly, embodiments according to the present invention provide a method and a structure for forming a stacked memory device and interconnect structures for the stacked memory device. But it should be recognized that the present invention can have a much broader range of applicability.

FIG. 1 is a conventional method of forming interconnects for a memory device. Cross section view and top view are shown. This typically occurs in the periphery, or outside, of the memory array. As shown, the conventional method includes providing a semiconductor substrate 102 having one or more CMOS devices formed. The one or more CMOS device usually includes an interconnect structure 104 to control the memory device. A first dielectric material 108 is formed overlying the interconnect structure and a plurality of via openings 110 are formed in a region of the first dielectric material. The openings are filled with a conductor material 112. The conductor material in the via structure is isolated by a first planarization process, for example, a polishing process or an etchback process. To form a bottom wiring structure for a memory array, a first metal material is formed overlying the first dielectric material and the via structure. The first metal material is patterned and etched to form the bottom wiring structure 114 for the memory array. The conventional method then forms one or more switching region overlying the bottom wiring structure for the memory device and form a second dielectric material overlying the first bottom wiring structure while a surface region of the one or more switching region is exposed.

FIG. 2 illustrates the steps of forming a top wiring structure according to the conventional method. Cross section view and a top view of a peripheral region are shown. As shown, a second via opening 202 is formed in a portion of the second dielectric material and the first dielectric material stack 204 to expose a surface region of the interconnect of the controlling circuitry. A conductor material 206 is formed to fill the second via openings and a second planarizing process is performed to remove the conductor material from the second dielectric material surface and to isolate the top wiring material in the second via structures. A top wiring material is formed overlying the second dielectric material and overlying the second via structure. The top wiring material is subjected to a second pattern and etch process to form a top wiring structure 208. For a crossbar array, the bottom wiring structure and the top wiring structure are spatially arranged perpendicular to each other. The switching region is formed in an intersecting region formed from the top wiring structure and the bottom wiring structure in a cell region to form a memory cell. As shown, the first via structure is formed in a first peripheral area to the memory array and the second via structure is formed in a second peripheral area to the memory array. As shown, to form the first wiring structures and the second wiring structures, and the respective via interconnects, at least three masks are needed.

Figure 2A:
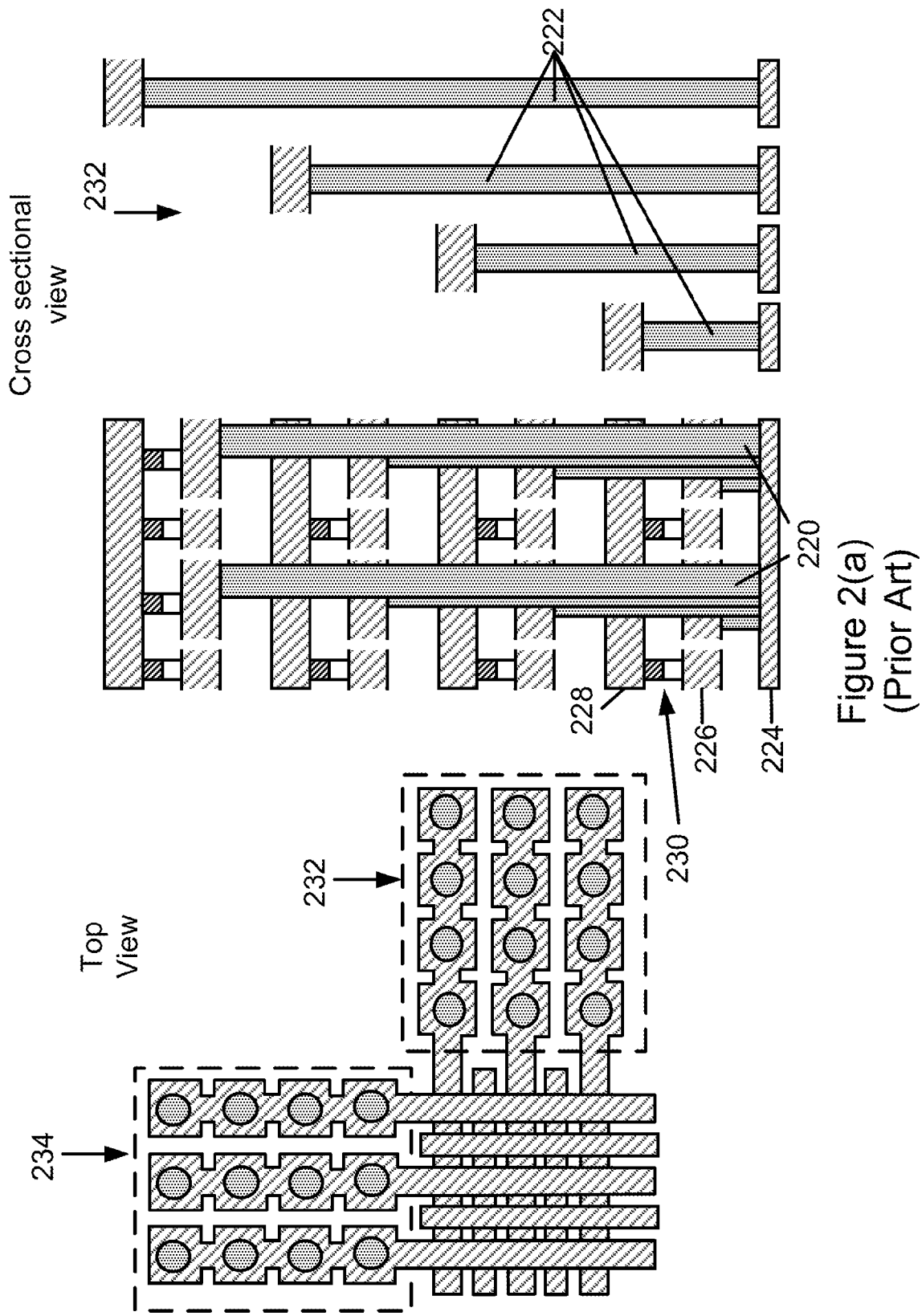

To form four layers of memory stack, for example, the conventional via fabrication method forms a first via connect 220 for a bottom wiring 226 and a second via connect 222 for a top wiring structure 228 for each layer of memory devices. The first via connect is disposed in a first periphery region 234 and the second via connect is disposed in a second periphery region 232, as shown in the top view diagram. As shown a switching device 230 is formed between an intersection region of a top wiring structure and a bottom wiring structure in each device layer in the cell region. Each of the first via interconnect and the second via interconnect is connected to a respective interconnect of the CMOS devices on the substrate 224 as shown in FIG. 2(a). Each of the layers of memory cells and the respective via structures are formed as in FIGS. 1 and 2. This includes a total of eight via modules and a costly way to connect each memory layer to the control circuitry on the substrate.

Figure 3:
Figure 4:
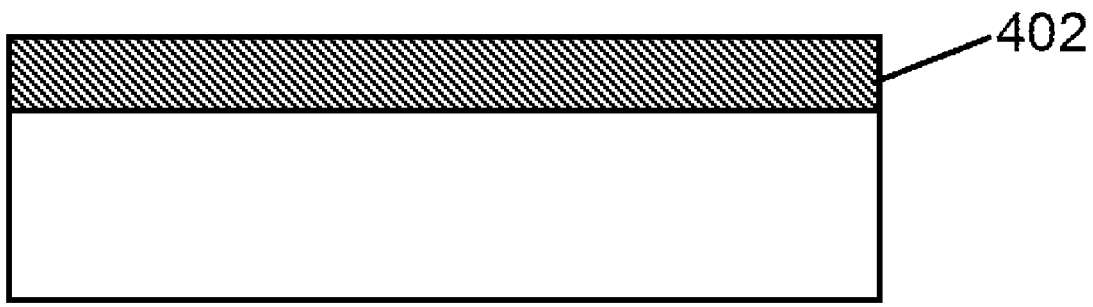

The present invention provides a method and a structure for forming interconnects for a crossbar array of memory cells and a multilayer (for example one to eight layers) of memory cells. Referring to FIG. 3, a semiconductor substrate 302 is provided. The semiconductor substrate can include a single crystal silicon, silicon germanium, or a silicon on insulator (commonly known as SOI) substrate. In a specific embodiment, the semiconductor substrate can further include one or more transistor devices formed thereon. The one or more transistor devices provide controlling circuitry for the memory device in a specific embodiment. As shown in FIG. 4, a metal, interconnect structure from the controlling circuitry is formed overlying the substrate in a specific embodiment.

Figure 5:
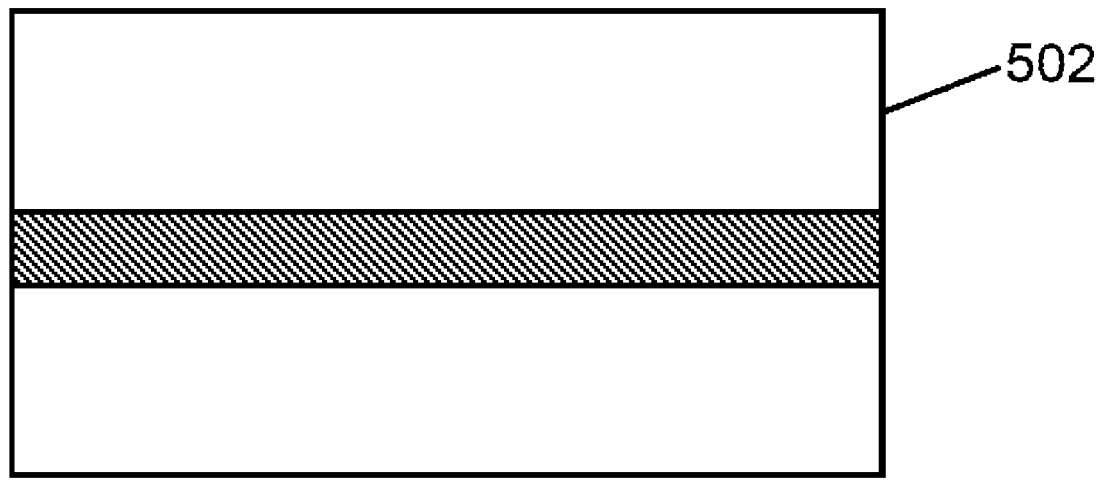

In a specific embodiment, the method includes forming a first dielectric material 502 overlying the substrate including the first metal interconnect structure as shown in FIG. 5. The first dielectric material can be a silicon oxide, a silicon nitride, a silicon oxide on silicon nitride on silicon oxide stack (ONO) depending on the embodiment. The first dielectric material can be deposited using a chemical vapor deposition (CVD) process, including plasma enhanced CVD, low pressure CVD, spin on glass (SOG), or any combination of these. The silicon oxide material can be doped using boron, phosphorous, fluorine or other material to provide for a suitable and desirable characteristic depending on the application.

Referring to FIG. 6, the method subjects the first dielectric material to a first pattern and etch process to form a first via opening 602 in a first peripheral region while a cell region is masked in a specific embodiment. Referring to FIG. 6a, a first wiring material 604 is deposited to fill the via and to form a thickness of first wiring material 606 overlying the first dielectric material at least in the cell array region in a specific embodiment. A diffusion barrier layer and/or an adhesion layer is usually first deposited conformably overlying the first via opening. The adhesion layer can be titanium, titanium nitride, tantalum nitride, tungsten nitride, depending on the application. The first wiring material can be copper, aluminum, silver, or tungsten depending on the application. The first wiring material used depends on the aspect ratio of via opening 602. For a via aspect ratio of less than about 1:7, aluminum, copper, or silver can be used as that first wiring material in a specific embodiment. For via aspect ratio of greater than 1:7, tungsten may be used. The first wiring material may be deposited using techniques such as sputtering, chemical vapor deposition, electrochemical deposition such as electroless deposition or electroplating, including any combination of these, and others. One skill in the art would recognize other variations, modifications, and alternatives.

In a specific embodiment, the method includes depositing a contact material overlying the first wiring material and a resistive switching material and a resistive switching material is formed overlying the contact material. For amorphous silicon as the resistive switching material, the contact material can be a polysilicon material in a specific embodiment. The polysilicon material controls a defect density overlying the first wiring material in a specific embodiment. The polysilicon material is preferably doped to have a p-type impurity characteristic. The polysilicon material is configured to have a suitable conductivity and a suitable contact resistance between the amorphous silicon material and the first wiring material in a specific embodiment. In certain embodiment, the contact material can be optional.

Figure 7A:
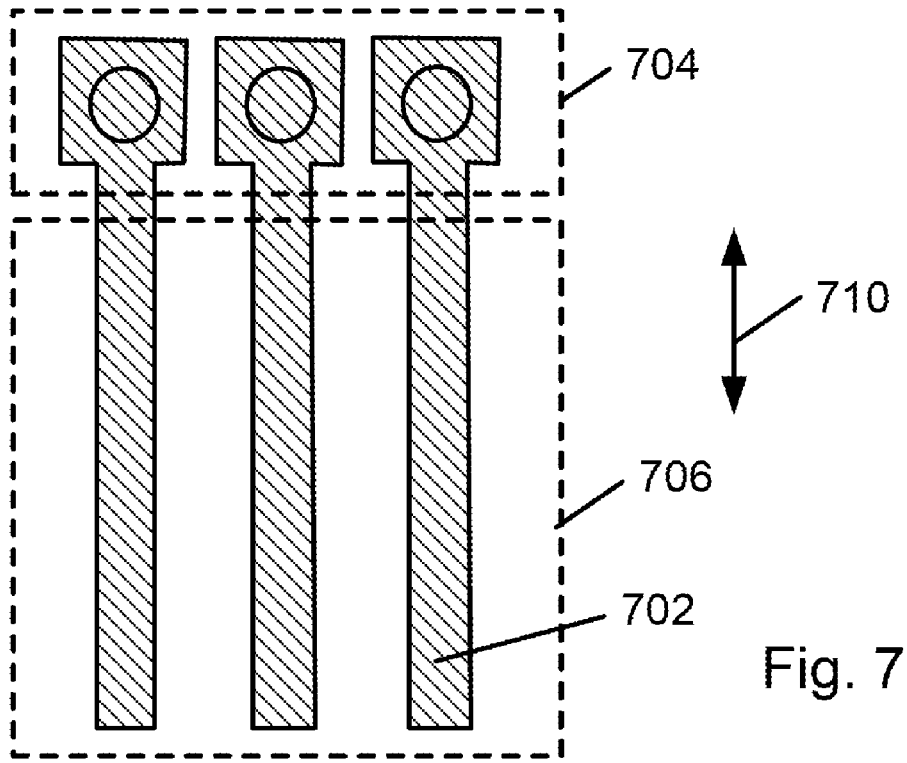
Figure 7B:
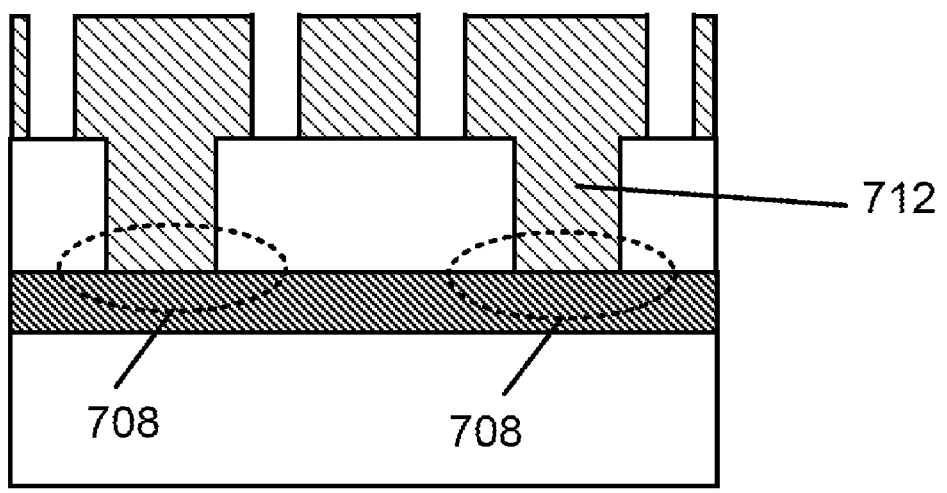

Referring to FIGS. 7a and 7b, the method subjects the resistive switching material, the contact material, and the first wiring material to a second pattern and etch process to form a first structure in the cell region. The first structure including a first wiring structure 702 in a specific embodiment. FIG. 7a illustrates a top view and FIG. 7b illustrates a cross section view. The first wiring structure is elongated in shape and configured to extend in a first direction 710 as shown in the top view in FIG. 7a. In a specific embodiment, the first wiring structure includes a bottom electrode structure in cell array 706 region and a via structure 712 in the first peripheral region as show in FIGS. 7a and 7b. The via structure electrically connects 708 the first wiring structure to respective transistor device formed on the substrate in a specific embodiment.

In a specific embodiment, the method forms a third dielectric material overlying the first structure and fills a gap region between the first structures. The third dielectric material is subjected to a planarization step to expose a resistive switching material surface in a specific embodiment.

Referring to FIG. 8. In a specific embodiment, the method includes forming a fourth dielectric material 804 overlying the first structure and include a thickness overlying the resistive switching material. The third dielectric material is subjected to a third pattern and etch process to form an opening region in the third dielectric material to expose a portion of the resistive switching material surface in a specific embodiment. A suitable conductor material is preferentially formed in the opening region in contact with the resistive switching material. For amorphous silicon material as the switching material, the conductor material can be a metal material such as silver, platinum, gold, nickel, aluminum, and others. In a specific embodiment, the conductor material used is silver deposited using physical vapor deposition, chemical vapor deposition, electrochemical, including electroplating and electroless plating, and a combination depending on the application.

In a specific embodiment, the method includes forming a second via opening region in a portion of the third dielectric material, the second dielectric material, and the first dielectric material in a second peripheral region of the cell array while masking the cell region. A second wiring material is formed overlying the conductor material and fills the second via opening region. The second wiring material can be copper, aluminum, tungsten, or silver depending on the application. The second wiring material further fills the second via opening and form a thickness of the second wiring material overlying the conductor material in a specific embodiment. As shown in FIG. 8, the method subjects the second wiring material to a third pattern and etch process to form a second wiring structure 802. In a specific embodiment, the second wiring structure is spatially arranged in a second direction at an angle to the first direction and includes a second via structure disposed in the second peripheral region in a specific embodiment. The second wiring structure includes a portion overlying the switching elements in the cell array region in a specific embodiment. A top view 806 of the memory device also shown.

The above sequence of steps provides a method to form a crossbar array of memory cells and via contact structures according to an embodiment of the present invention. Depending on the application, one or more steps may be added, one or more steps may be omitted, or one or more step may be provided in a different sequence. One skilled in the art would recognize other variations, modifications, and alternatives.

In a specific embodiment, the present invention provides a method and a structure for forming vertical interconnects for a multilayer or stacked memory cell device. Depending on the embodiment, the multilayer cell device can include one to eight layers of cell array. In a specific embodiment, each of the cell array is configured as a crossbar array. The method includes providing a substrate having a surface region. The substrate includes one or more transistor devices for controlling circuitry for the memory device. A first dielectric material is formed overlying the semiconductor substrate. In a specific embodiment, the method defines a cell region, a first peripheral region, and a second peripheral region.

The method forms a first bottom wiring structure overlying the first dielectric material. The first bottom wiring structure is spatially extending in a first direction and includes at least a first portion disposed in the first peripheral region. The method forms a first switching region overlying the first bottom wiring structure in a specific embodiment. A first top wiring structure is formed overlying the first switching region. In a specific embodiment, the first top wiring structure is configured to extend in a second direction orthogonal to the first bottom wiring structure forming a first crossbar array of memory cells. The first top wiring structure further includes a portion disposed in a second peripheral region and includes a via structure configured in the second peripheral region electrically connected to a respective controlling circuitry in a specific embodiment. The switching region is sandwiched in an intersection region between the first top wiring structure and the first bottom wiring structure in the cell array region in a specific embodiment.

To form a second crossbar array of memory cells stack above the first crossbar array of memory cells, the method includes forming a fourth dielectric material overlying the first top wiring structure of the first crossbar array of memory cells of memory devices. The method forms a second bottom wiring structure for the second crossbar array of memory cells overlying the second dielectric material. The second bottom wiring structure is configured to extend parallel to the first bottom wiring structure separated by a dielectric stack comprising of each of the dielectric materials in a specific embodiment.

Figure 9:
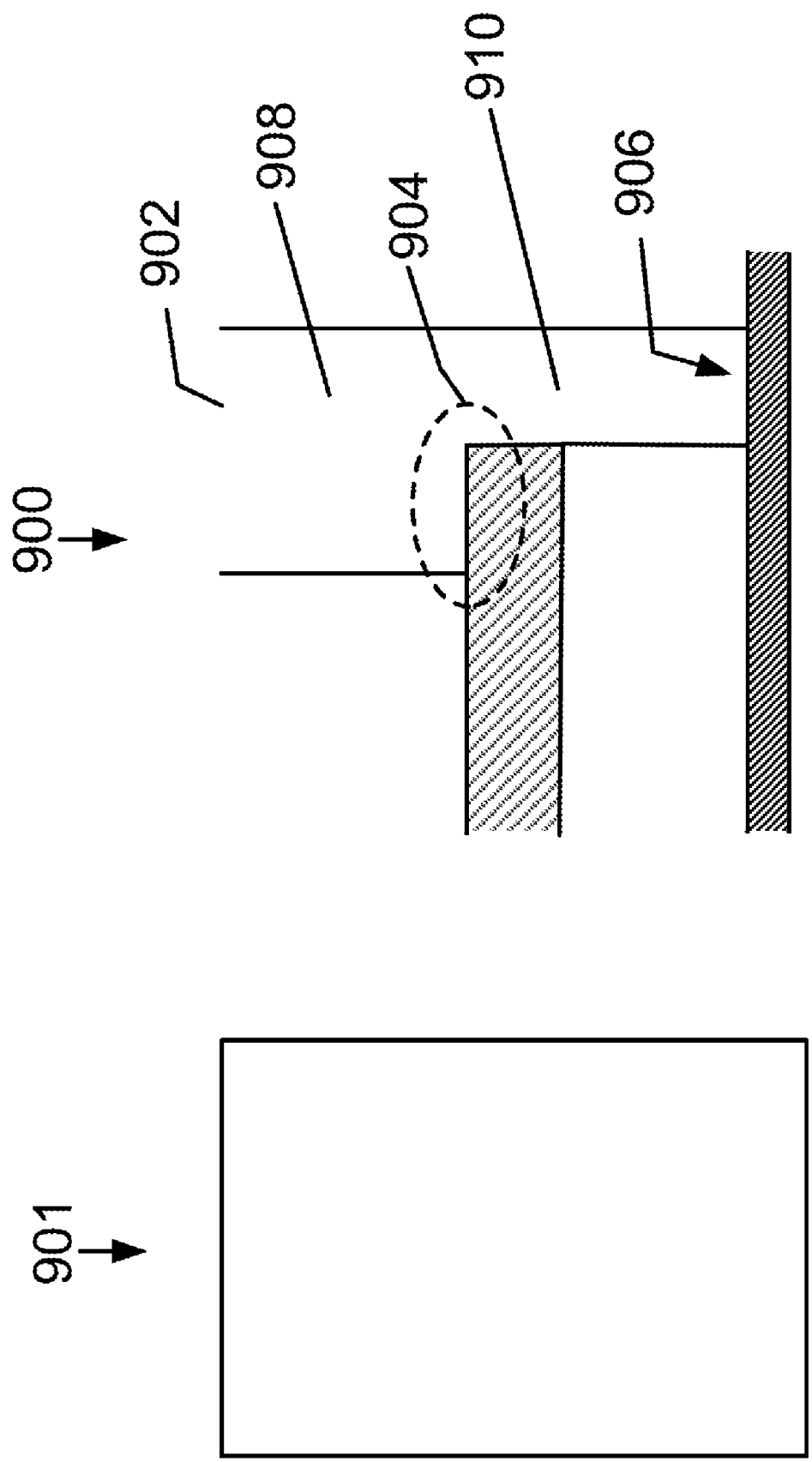

In a specific embodiment, the method forms a first via opening 902 in a portion of a thickness of dielectric material in a first peripheral region 900 as shown in FIG. 9. Cell region 901 is also shown. The first via opening exposes a portion 904 of the first bottom wiring structure and further extends to expose a portion 906 of an interconnect conductor of the transistor device in a specific embodiment. The first via opening is formed by a pattern and a dielectric etch process and includes a first opening region 908 and a second opening region 910, and the first opening region is larger than the second opening region in a specific embodiment.

Figure 10:
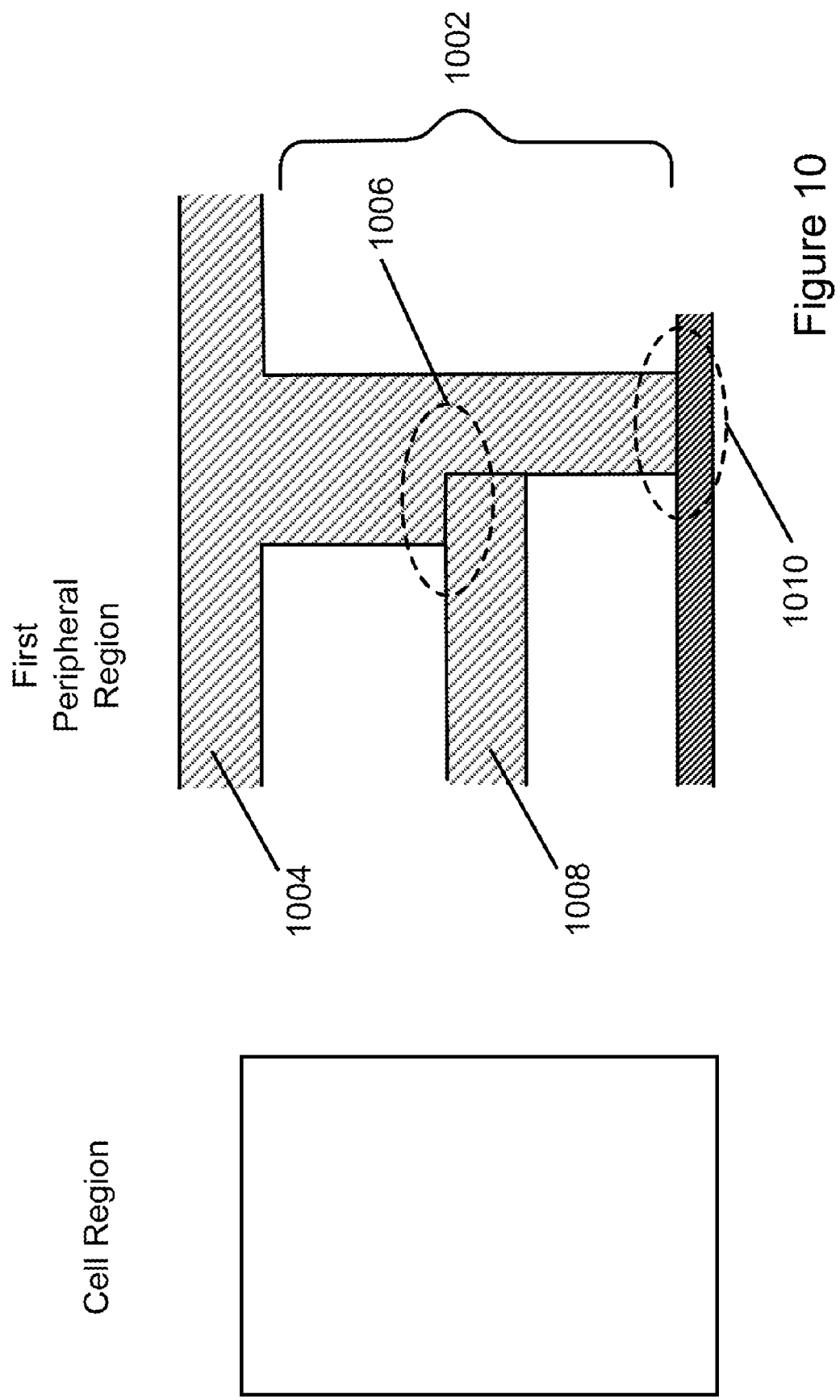

Referring to FIG. 10, the method deposits a second bottom wiring material to fill the first via opening to form a first via structure 1002. The second bottom wiring material further forms a thickness overlying the dielectric material in a specific embodiment. In a specific embodiment, the method includes subjecting the second bottom wiring material to a pattern and etch process to form a second bottom wiring structure 1004 in the cell region. As shown, the first via structure is common to a first bottom wiring structure 1008 and the second bottom wiring structure and connects the second bottom wiring structure and the first bottom wiring stricture to an interconnect 1010 of the transistor on the substrate in a specific embodiment. In a specific embodiment, the second bottom wiring structure is configured to extend in a direction parallel to the first bottom wiring structure. As illustrated, the present embodiment forms an interconnect structure to provide connection of the first array of memory device and the second array of memory device to the controlling circuitry on the substrate in a single pattern and etch step. This is in contrast to the conventional method whereby one via structure is used for each of the memory array thus incur at least two pattern and etch steps for two memory arrays.

The method forms at least one second switching region overlying the second bottom electrode using the same process as the first switching region in the cell region. The method further forms a second top wiring structure overlying the second switching region. Referring again to FIG. 8, the second top wiring structure is configured to extend in the second direction and parallel to the first top wiring structure and include a via structure in the second peripheral region 802 in a specific embodiment.

Figure 11:
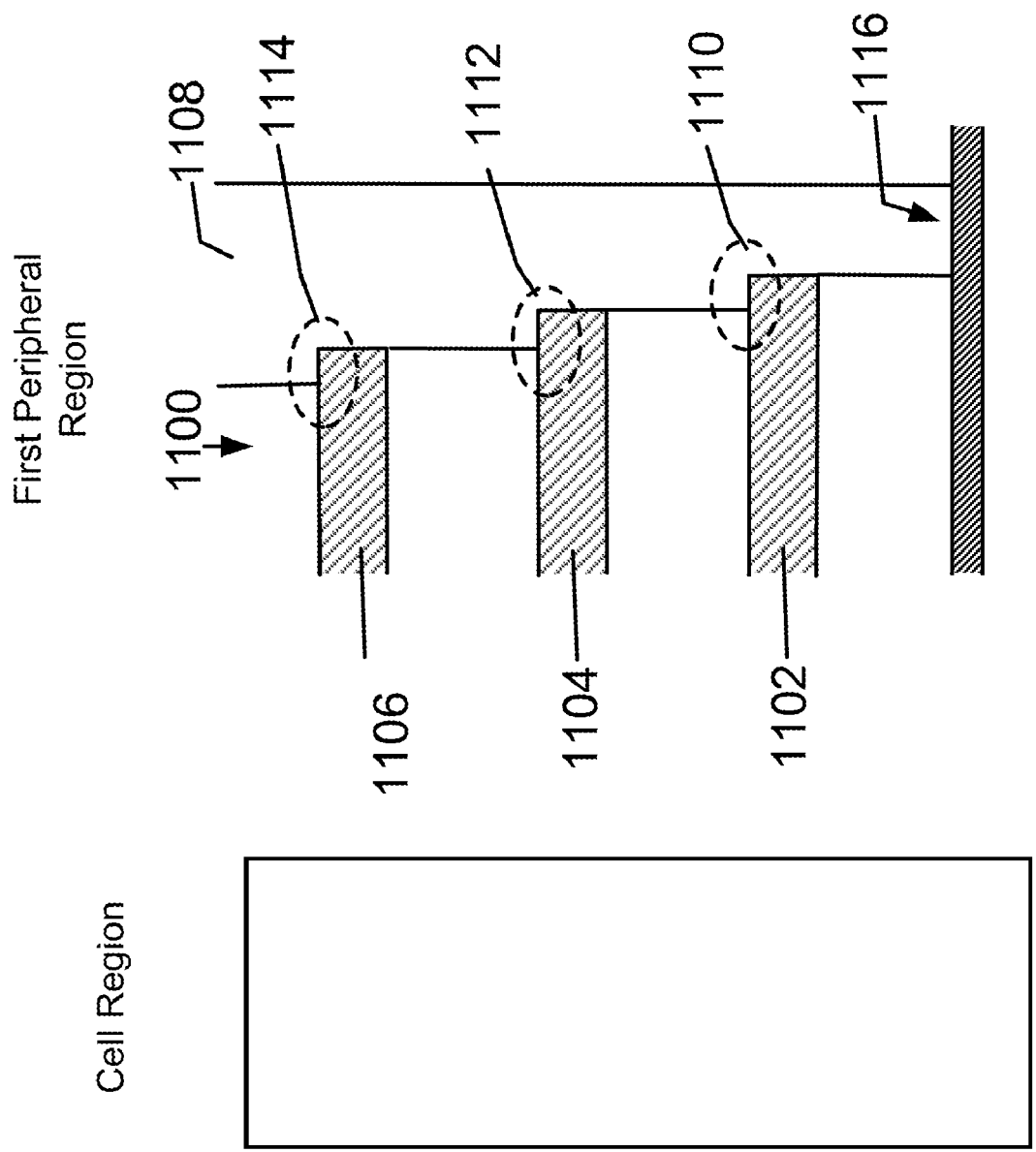

FIG. 11 illustrates a method and a structure for a via structure to connect multilayer memory device (two or more layers of memory devices) to a respective transistor on the substrate according to an embodiment of the present invention. In this example, four layers of memory cells are formed. Each of the memory layers may be formed as described for the two memory layer device. A first bottom wiring structure 1102 for a first layer of memory device, a second bottom wiring structure 1104 for a second layer of memory device, and a third bottom wiring structure 1106 for a third layer of memory device are illustrated. After forming the third layer of memory device, a via opening 1108 is formed in a first peripheral region 1100. As shown, the via opening further exposes a portion of the first bottom wiring structure 1110, a portion of the second bottom wiring structure 1112, a portion of the third bottom wiring structure 1114 in addition to exposing a portion of an interconnect structure 1116 for the transistor.

Figure 12:
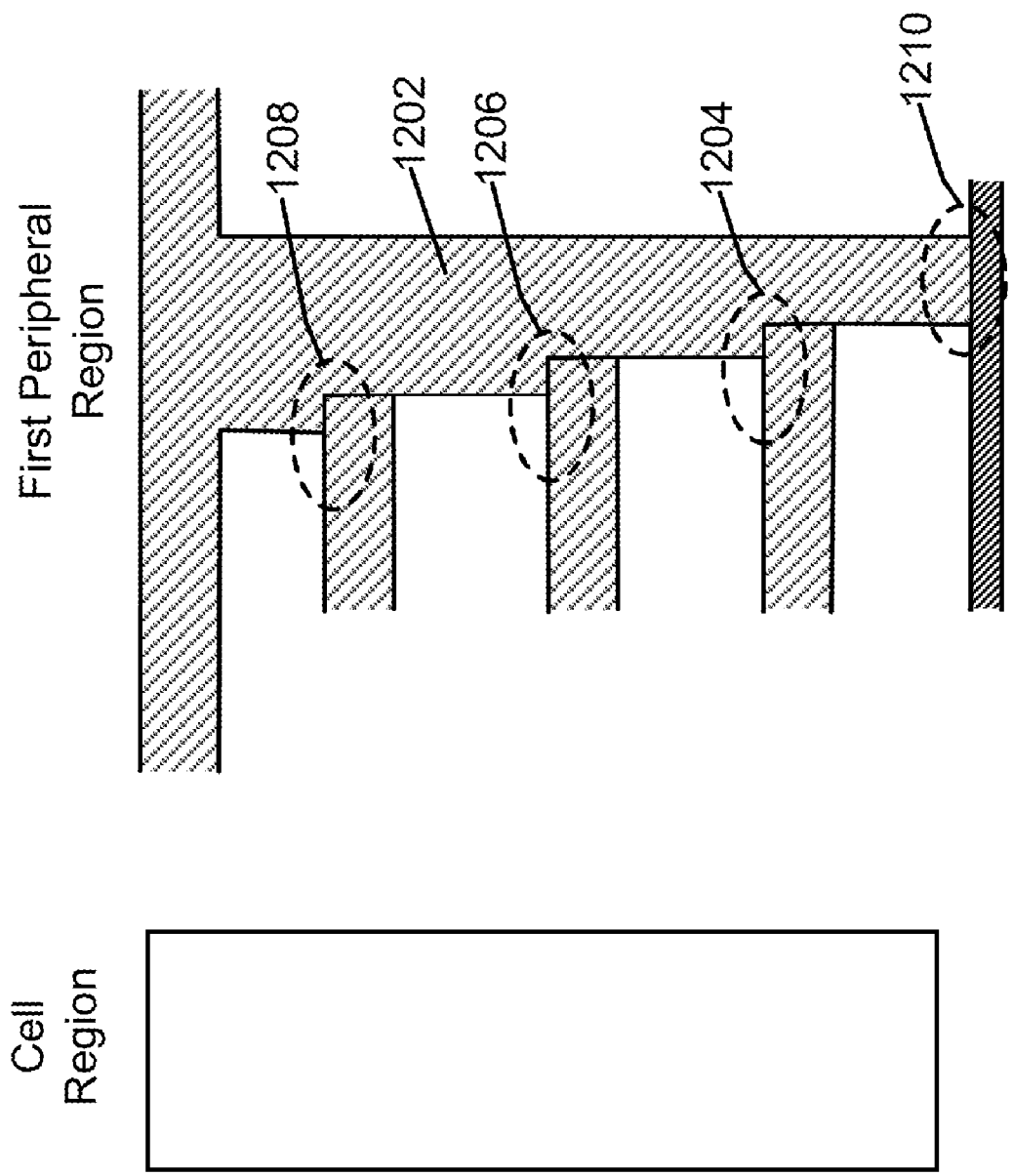

The method deposits a fourth wiring material to fill via opening 1108 to form a via structure 1202 as shown in FIG. 12. The fourth wiring material is usually the same material for each of the first wiring structure, the second wiring structure, and the third wiring structure in a specific embodiment, though different materials may also be used. As shown, via structure 1202 has a first contact region 1204 with the first bottom wiring structure, a second contact region 1206 with the second bottom wiring structure, and a third contact region 1208 with the third bottom wiring structure in a specific embodiment. Via structure 1202 connects the first wiring structure, the second wiring structure, the third wiring structure, and the fourth wiring structure to the substrate 1210 in a specific embodiment. Depending on an aspect ratio of the via structure, the fourth wiring material can be copper, silver, tungsten or aluminum. For aspect ratio greater than about 1:7, tungsten provides better fill characteristic than, for example aluminum. Silver would be the preferred fill material due its ability to have very low resistance and to fill high aspect ratio vias, and its use as part of the memory cell. Depending on the application, the single via structure can be configured to connect the respective bottom wiring structures of the each of the crossbar memory arrays to the control circuitry on the substrate. By forming a single via structure to electrically connect, for example, respectively the first bottom wiring structures, the second bottom wiring structure, the third bottom wiring structure and the fourth bottom wiring structure to the controlling circuitry on the substrate, fewer etch steps are needed, greatly simplifies the fabricating process.

Figure 13:
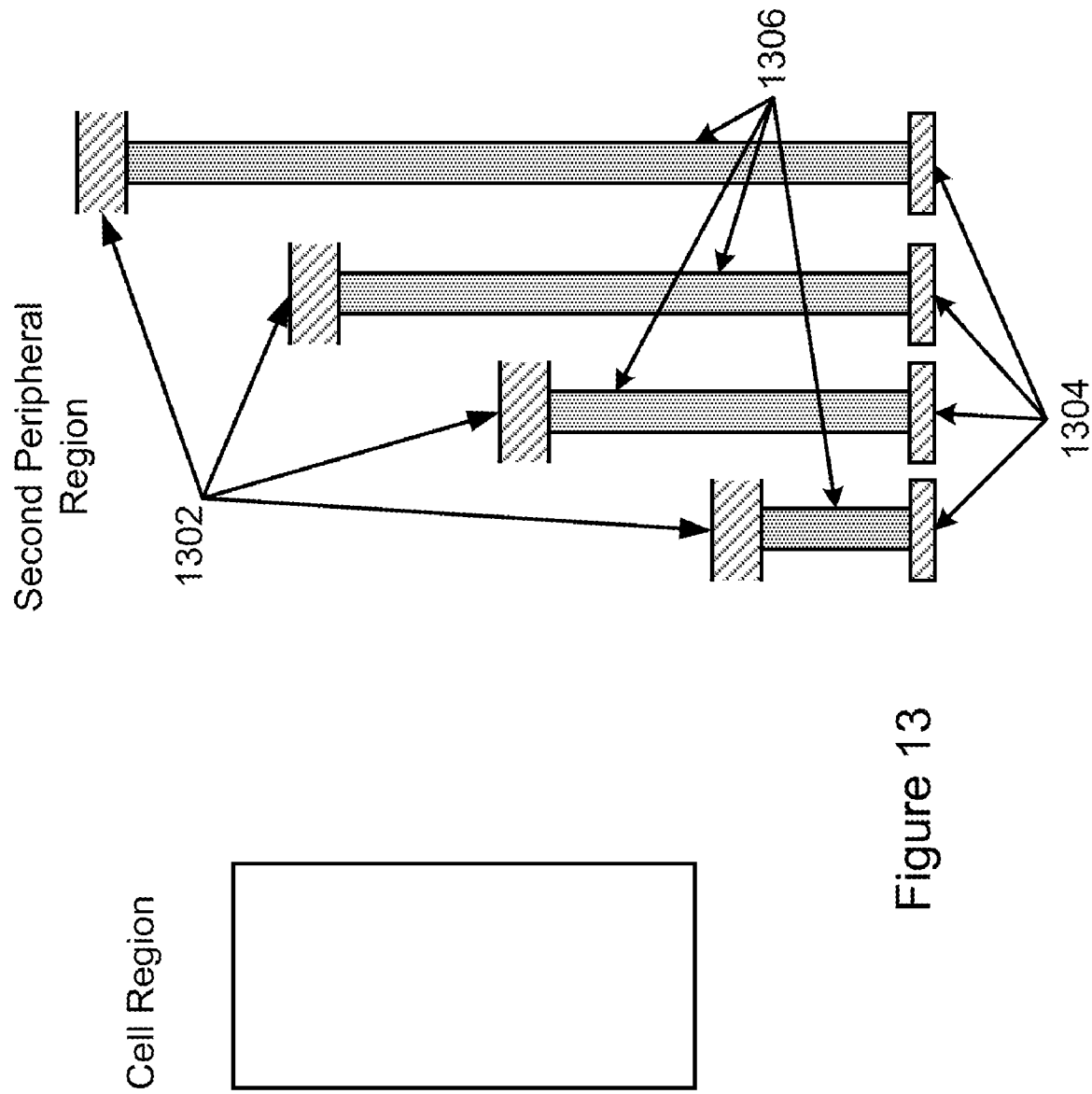

As illustrated in FIG. 13, for the memory device having four layers of memory cells, top wiring structures 1302 for each of the respective device layers are configured to connect to their respective controlling circuitry 1304 on the substrate using their respective via structures 1306 or respective signal vias. The top wiring via structures are disposed in a second peripheral region in a specific embodiment.

Figure 14:
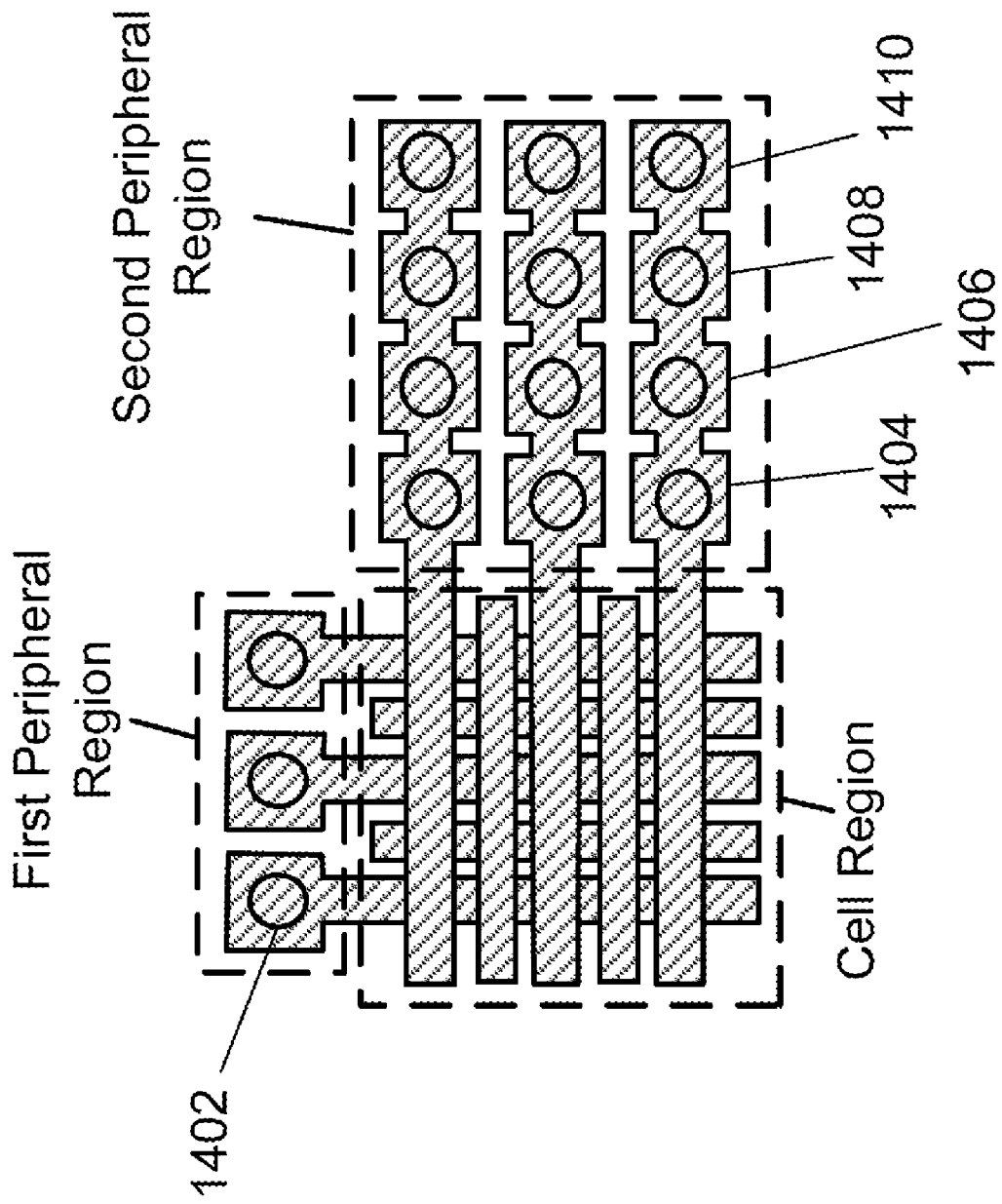

FIG. 14 illustrates a top view of the four layer memory device structure. A single via structure 1402 connects, for example, the respective bottom wiring structures for each of the crossbar layers of memory cell are configured in first peripheral region. The respective top wiring structures of each of the respective device layers arrays is connected to the respective control circuits using their respective via structure 1404, 1406, 1408, and 1410.

Depending on the application, there can be other variations. For example, to form a memory device having four layers of crossbar structures, the via structure can be form in more than one steps. A first via structure connecting the first bottom wiring structure and the second bottom wiring structure to the controlling circuitry on the substrate is formed. A second via structure can be formed in a separate step to connect the third and the fourth bottom wiring structures to the first via structure. The first via structure and the second via structure would have a smaller aspect ratio and aluminum can be used as the wiring material in a specific embodiment. Of course one skilled in the art would recognize other variations, modifications, and alternatives.

Additionally, the present invention has been described using a via structure to connect the bottom wiring structures of a stack of memory cells. Alternatively, the top wiring structures may be electrically connected using a single via structure and the bottom wiring structures can each be connected to their respective controlling transistors on the substrate using respective via structures. The one via connecting many cells might be called a "mast" via, while the single vias connecting to a single layer are called "signal" vias.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a vertical interconnect for a memory device, comprising:
   providing a substrate having a surface region;
   defining a cell region, a first peripheral region, and a second peripheral region;
   forming a first thickness of dielectric material overlying the surface region;
   forming a first bottom wiring structure spatially configured to extend in a first direction overlying the first dielectric material for a first array of devices;
   forming a second thickness of a dielectric material overlying the first wiring structure;
   forming an opening region in the first peripheral region extending in a portion of at least the first thickness of dielectric material and the second thickness of dielectric material to expose a portion of the first wiring structure and to expose a portion of the substrate;
   depositing a second bottom wiring material overlying the second thickness of dielectric material and filling the opening region to form a vertical interconnect structure in the first peripheral region; and
   forming a second bottom wiring structure from the second wiring material for a second array of devices, the second bottom wiring structure being separated from the first bottom wiring structure by at least the second thickness of dielectric material, the second bottom wiring structure being spatially configured to extend in the first direction, the first wiring structure and the second wiring structure being electrically connected by the vertical interconnect structure in the first peripheral region to the substrate.

2. The method of claim 1 wherein the substrate comprises one or more transistor device, the one or more transistor device providing control circuitry for the first array of devices and the second array of devices.

3. The method of claim 1 wherein the first bottom wiring material and the second wiring material each comprises aluminum, tungsten, or copper.

4. The method of claim 1 wherein the first bottom wiring material comprises silver.

5. The method of claim 1 wherein the second bottom wiring material comprises silver.

6. The method of claim 1 wherein the first array of devices further comprises a first top wiring structure spatially orientated in a second direction orthogonal to the first direction and at least one first switching element disposed in a first intersecting region between the first top wiring structure and the first bottom wiring structure.

7. The method of claim 1 wherein the second array of devices further comprises a second top wiring structure spatially orientated in the second direction and at least one second switching elements disposed in a second intersecting region between the second top wiring structure and the second bottom wiring structure.

8. The method of claim 1 wherein the first top wiring structure and the second top wiring structure are respectively connected to their controlling transistors on the substrate by respectively a first vertical connect structure and a second vertical connect structure formed in the second peripheral region.

9. The method of claim 1 further comprises forming a third array of devices separated by a third dielectric material from the second array of devices, the third array of devices comprise at least a third bottom wiring structure configured to extend in the first direction, and the vertical interconnect structure further extend to electrically connect the first bottom wiring structure, the second bottom wiring structure and the third bottom wiring structure to the substrate.

10. The method of claim 1 further comprises forming an Nth array of devices separated at least by an Nth dielectric material from an (N−1)th array of devices, the Nth array of devices comprise at least an Nth bottom wiring structure configured to extend in the first direction, and the vertical interconnect structure further extend to electrically connect each of the N bottom wiring structures, to the substrate, N being an integer ranging from 1 to 8.

11. The method of claim 6 wherein the first top wiring structure comprises copper, tungsten, or aluminum.

12. The method of claim 6 wherein the first top wiring structure comprises silver.

13. The method of claim 6 wherein the first top wiring structure includes a portion comprising a metal material in direct contact with the first switching element.

14. The method of claim 6 wherein the first switching element comprises an amorphous silicon material.

15. The method of claim 7 wherein the second top wiring structure comprises copper, tungsten, or aluminum.

16. The method of claim 7 wherein the second top wiring structure comprises silver.

17. The method of claim 7 wherein the second top wiring structure includes a portion comprising a metal material in direct contact respectively with each of the one or more second switching element.

18. The method of claim 7 wherein the second switching element comprises an amorphous silicon material.

19. The method of claim 9 wherein the third array of devices further comprises a third top wiring structure spatially configured in the second direction and at least one third switching element disposed in a third intersecting region between the third top wiring structure and the third bottom wiring structure, the third top wiring structure including a third vertical connect structure configured in the second peripheral region.

20. The method of claim 10 wherein the Nth array of devices further comprises at least an Nth top wiring structure configured to extend in the second direction, the Nth top wiring structure having an Nth vertical connect structure configured in the second peripheral region.

21. The method of claim 13 wherein the metal material comprises silver, copper, nickel, platinum, palladium, or aluminum, and combinations thereof.

22. The method of claim 17 wherein the metal material comprises silver, copper, nickel, platinum, palladium, or aluminum, and combinations thereof.

* * * * *